US012578368B2

(12) United States Patent
Thimmappa et al.

(10) Patent No.: US 12,578,368 B2
(45) Date of Patent: Mar. 17, 2026

(54) ROTATION MECHANISM FOR MEASURING DEVICE

(71) Applicant: SCHNEIDER ELECTRIC INDUSTRIES SAS, Rueil Malmaison (FR)

(72) Inventors: Umesh Thimmappa, Bangalore (IN); Sreekanta Swamy, Bangalore (IN); Narayan Devaray Acharya, Bangalore (IN)

(73) Assignee: Schneider Electric Industries SAS, Rueil Malmaison (FR)

( * ) Notice: Subject to any disclaimer, the term of this patent is extended or adjusted under 35 U.S.C. 154(b) by 150 days.

(21) Appl. No.: 18/414,747

(22) Filed: Jan. 17, 2024

(65) Prior Publication Data

US 2025/0060396 A1      Feb. 20, 2025

(30) Foreign Application Priority Data

Aug. 14, 2023    (IN) .............................. 202311054600

(51) Int. Cl.
*G01R 22/06*            (2006.01)
(52) U.S. Cl.
CPC .................................. *G01R 22/065* (2013.01)
(58) Field of Classification Search
CPC .................................................... G01R 22/065
USPC .......................................................... 324/156
See application file for complete search history.

(56) References Cited

U.S. PATENT DOCUMENTS

| | | | | | |
|---|---|---|---|---|---|
| 5,933,004 | A | * | 8/1999 | Jackson | G01R 22/065 |
| | | | | | 324/156 |
| 5,966,010 | A | * | 10/1999 | Loy | G01R 11/04 |
| | | | | | 324/141 |
| 2003/0025493 | A1 | * | 2/2003 | Fye | G01R 22/065 |
| | | | | | 324/156 |
| 2004/0066609 | A1 | * | 4/2004 | Loy | G01R 22/065 |
| | | | | | 361/664 |

(Continued)

FOREIGN PATENT DOCUMENTS

| | | | |
|---|---|---|---|
| JP | 2010112737 | A | 5/2010 |
| JP | 5043803 | B2 | 10/2012 |

OTHER PUBLICATIONS

Translation of JP 20100112737 (Year: 2010).*
Extended European Search Report from corresponding European Application No. 24158708.8 dated Aug. 5, 2024.

*Primary Examiner* — Christopher P Mcandrew
(74) *Attorney, Agent, or Firm* — Patterson + Sheridan, LLP

(57) ABSTRACT

A mechanism includes a front support and a back support, each having first and second opposing surfaces and a circular-shaped opening formed in a center portion of the support. A connecting feature is positioned around a periphery of the circular-shaped opening of the front support, and is configured to be received in the circular-shaped opening of the back support to releasably secure the front support to the back support. The back support and a back portion of a measuring device are configured to be rotated in a clockwise or counterclockwise direction with respect to the front support and a front portion of the measuring device about an axis of the circular-shaped opening formed of the front support and the circular-shaped opening of the back support to enable flexible access to the electrical connections on the back portion of the measuring device.

20 Claims, 8 Drawing Sheets

(56)  References Cited

U.S. PATENT DOCUMENTS

| | | | |
|---|---|---|---|
| 2005/0270016 A1 * | 12/2005 | Karanam | ............... G01R 22/10 |
| | | | 324/157 |
| 2012/0055274 A1 | 3/2012 | Hershey et al. | |
| 2016/0258780 A1 * | 9/2016 | Torres | ................. G01R 22/061 |
| 2022/0397433 A1 | 12/2022 | May et al. | |

* cited by examiner

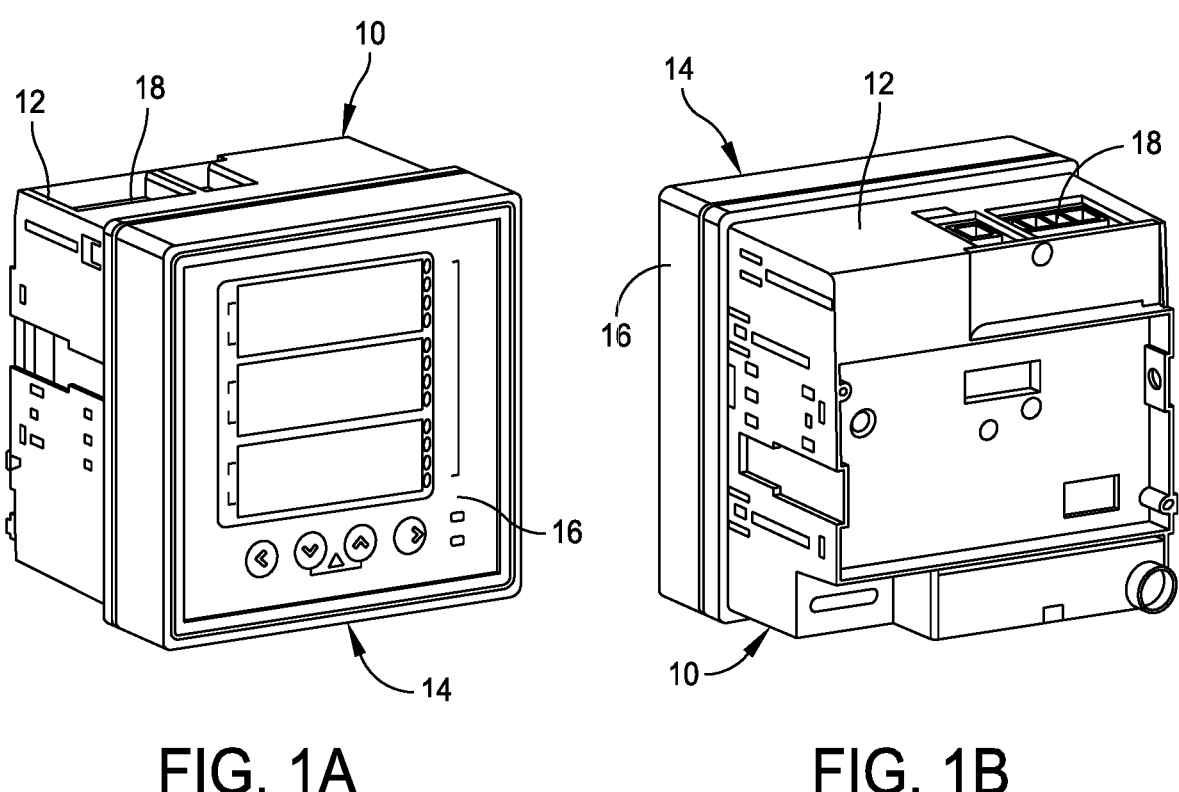
FIG. 1A                    FIG. 1B
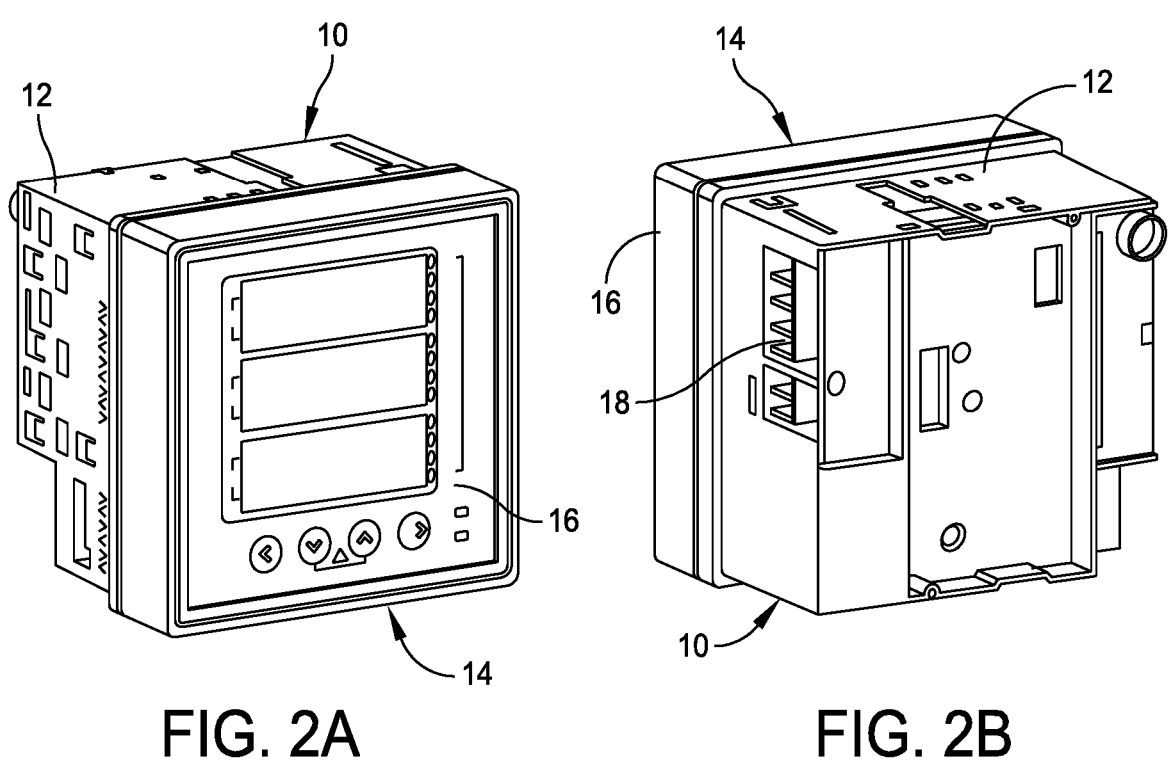
FIG. 2A                    FIG. 2B

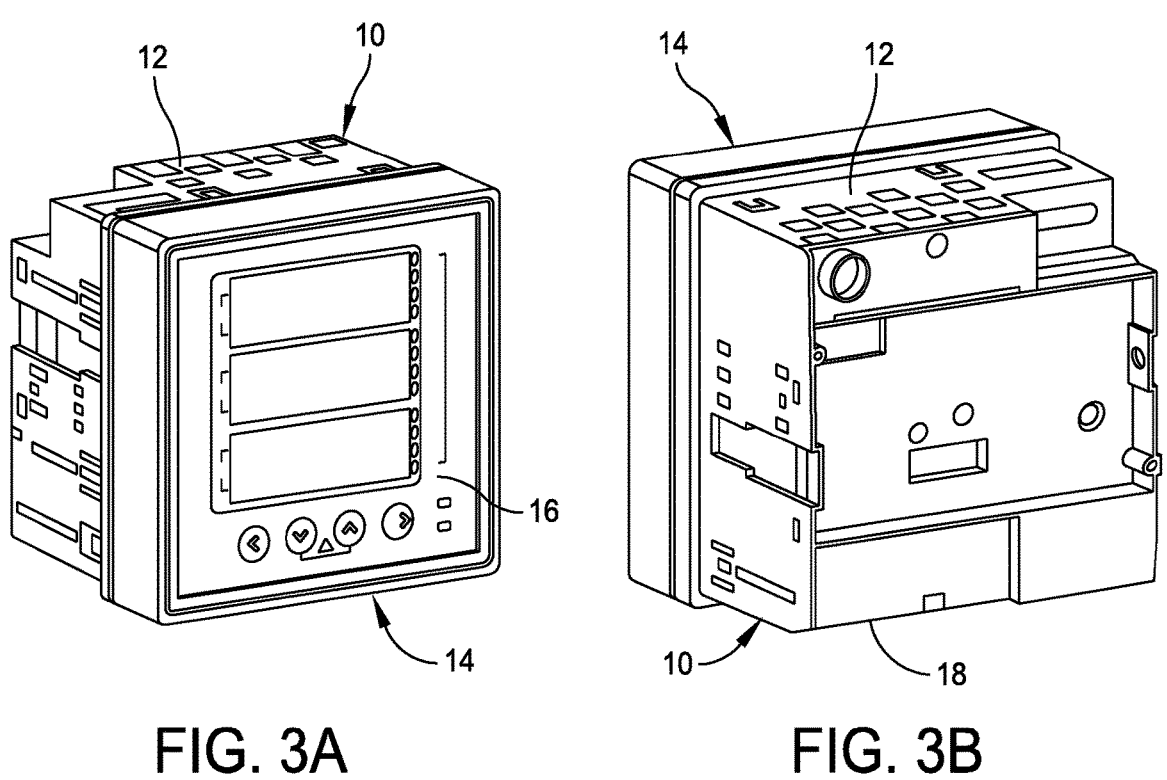
FIG. 3A
FIG. 3B
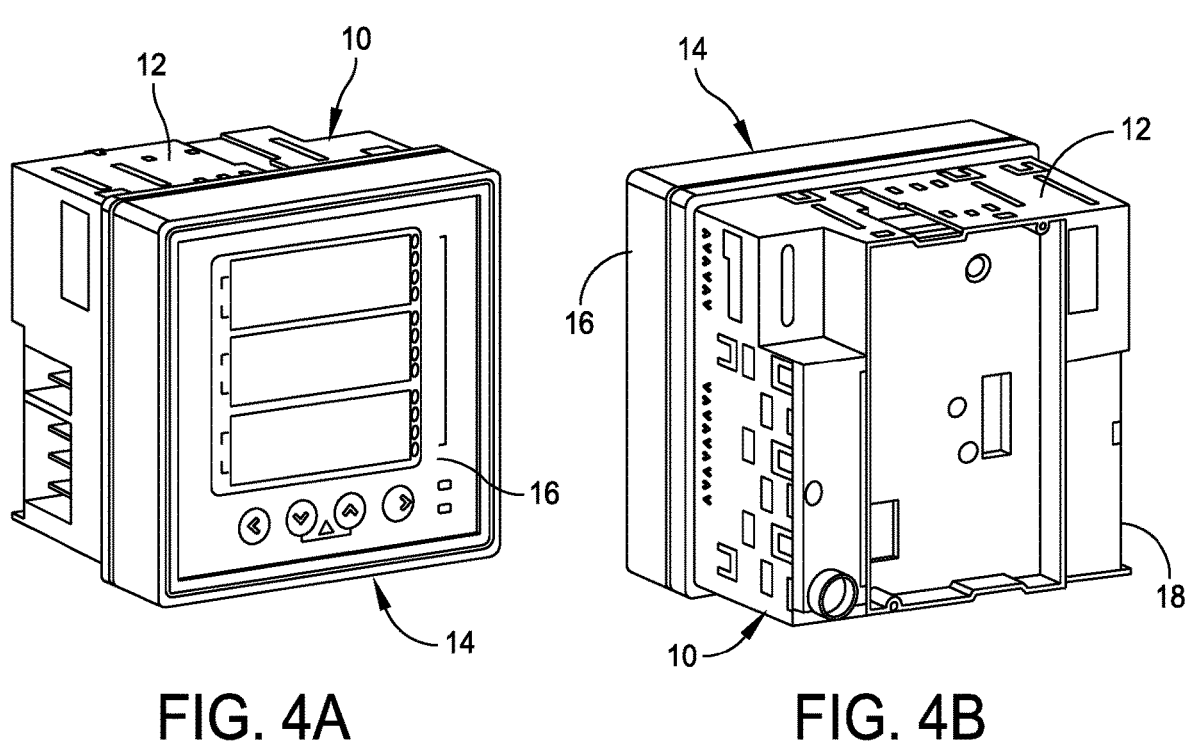
FIG. 4A
FIG. 4B

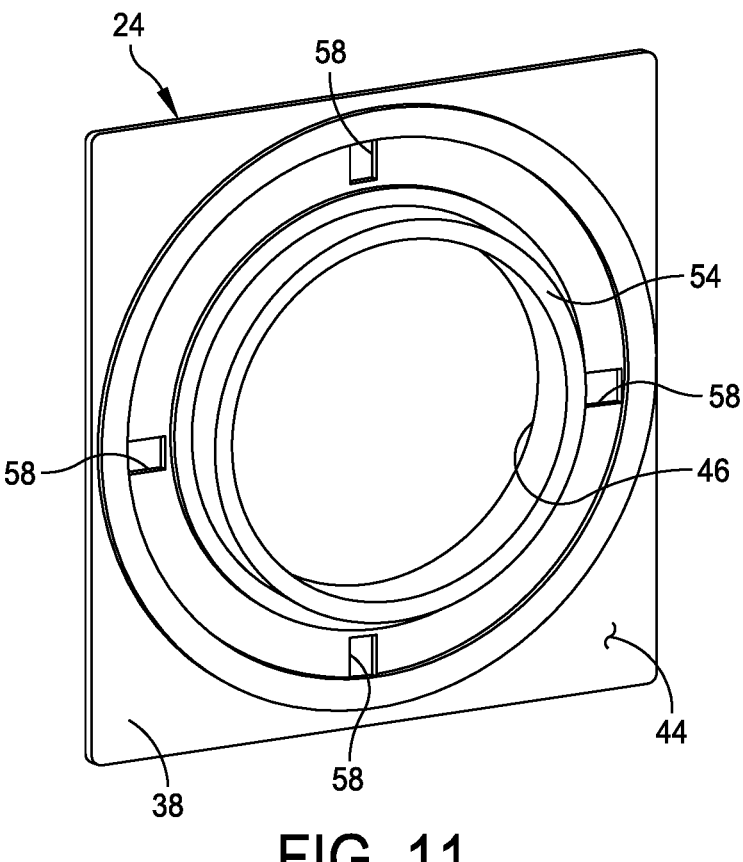
FIG. 11
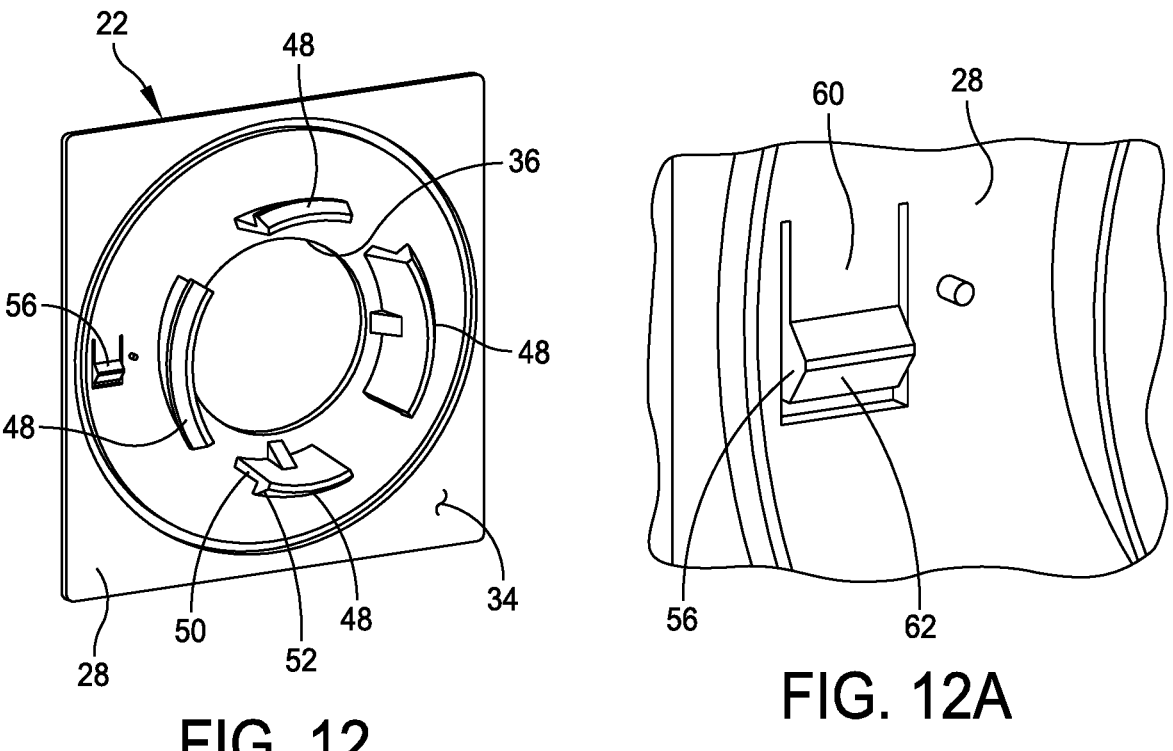
FIG. 12
FIG. 12A

ROTATION MECHANISM FOR MEASURING DEVICE

CROSS-REFERENCE TO RELATED APPLICATIONS

This application claims priority under 35 U.S.C. § 119 to Indian Patent Application number 202311054600, titled "ROTATION MECHANISM FOR MEASURING DEVICE," filed on Aug. 14, 2023, which is hereby incorporated by reference in its entirety.

BACKGROUND OF DISCLOSURE

1. Field of Disclosure

This disclosure is directed to measuring devices, and more particularly to a rotation mechanism used to secure a display to a measuring device, such as an energy metering device.

2. Discussion of Related Art

Often, wiring layouts are pre-wired in panels by panel builders for energy meter applications, each panel potentially having a different orientation. By having electrical connections in fixed positions, measuring device installation options are quite limited, resulting in lost opportunities and/or higher installation costs. For a particular metering device, the panel builder must properly orient the back of the energy meter to connect the energy meter to the wiring layout, while maintaining a display associated with the energy meter in a vertical orientation.

SUMMARY OF THE DISCLOSURE

One aspect of the present disclosure is directed to a mechanism for enabling relative rotation of front and back portions of a measuring device to provide flexible access to electrical connections during installation of the measuring device. In one embodiment, the mechanism comprises a front support having first and second opposing surfaces and a circular-shaped opening formed in a center portion of the front support. The front support is configured to be coupled to a front portion of the measuring device including a display of the measuring device. The mechanism further comprises a back support having first and second opposing surfaces and a circular-shaped opening formed in a center portion of the back support. The back support is configured to be coupled to a back portion of the measuring device including electrical connections of the measuring device. One of the front support and the back support includes a connecting feature positioned around a periphery of the circular-shaped opening. The connecting feature is configured to be received in the circular-shaped opening of the other of the front support and the back support to releasably secure the one of the front support and the back support to the other of the front support and the back support. The back support and the back portion of the measuring device are configured to be rotated in a clockwise or counterclockwise direction with respect to the front support and the front portion of the measuring device about an axis of the circular-shaped opening formed in the center portion of the front support and the circular-shaped opening formed in the center portion of the back support to enable flexible access to the electrical connections on the back portion of the measuring device.

Embodiments of the mechanism further may include a gasket positioned between the front support and the back support. The connecting feature may be formed on the second surface of the front support and extends towards the back support. The second surface of the back support may include a mating connecting feature configured to be releasably secured by the connecting feature of the front support, the mating connecting feature extending towards the back portion of the measuring device. The connecting feature may include a plurality of snap-fit connectors disposed on the periphery of the circular-shaped opening of the front support. The mating connecting feature may include an annular rim formed on the second surface of the back support around the circular-shaped opening of the back support. The plurality of snap-fit connectors may be configured to be releasably secured to the annular rim. Each snap-fit connector of the plurality of the snap-fit connectors may be configured to be self-guiding and to rotate over a sub-surface of the annular rim. One of the front support and the back support may include at least one detent and the other of the front support and the back support may include a corresponding plurality of detent receiving openings each being configured to receive the at least one detent to securely position the front support with respect to the back support. The at least one detent may be configured to be released from a respective opening when applying a force to one of the front and back portions of the measuring device. The at least one detent may be configured to be received in a different detent receiving opening after releasing the at least one detent from the respective opening and rotating one of the front and back portions at least 90 degrees. The at least one detent may be formed on the second surface of the front support and extends towards the back support. The detent receiving openings may be formed in the back support. The circular-shaped opening formed in the center portion of the front support may have a first diameter and the circular-shaped opening formed in the center portion of the back support has a second, different diameter.

Another aspect of the present disclosure is directed to a method of assembling a measuring device including front and back portions configured to rotate with respect to one another to provide flexible access to electrical connections during installation of the measuring device. In one embodiment, the method comprises: releasably securing a front support to a front portion of the measuring device including a display of the measuring device, the front support including first and second opposing surfaces and a circular-shaped opening formed in a center portion of the front support; releasably securing a back support to a back portion of the measuring device including electrical connections of the measuring device, the back portion including first and second opposing surfaces and a circular-shaped opening formed in a center portion of the back support; positioning a connecting feature of one of the front support and the back support within the circular-shaped opening of the other of the front support and the back support to releasably secure the one of the front support and the back support to the other of the front support and the back support, the connecting feature being positioned around a periphery of the circular-shaped opening of the one of the front support and the back support; and rotating the back support and the back portion of the measuring device in a clockwise or counterclockwise direction with respect to the front support and the front portion of the measuring device about an axis of the circular-shaped opening formed in the center portion of the front support and the circular-shaped opening formed in the center portion of the back support to enable flexible access to the electrical connections on the back portion of the measuring device.

Embodiments of the method further may include positioning a gasket between the front support and the back support. The connecting feature may be formed on the second surface of the front support and extends towards the back support. The second surface of the back support may include a mating connecting feature configured to be releasably secured by the connecting feature of the front support. The mating connecting feature may extend towards back portion of the measuring device. The connecting feature may include a plurality of snap-fit connectors disposed on the periphery of the circular-shaped opening of the front support. The mating connecting feature may include an annular rim formed on the second surface of the back support around the circular-shaped opening of the back support. The plurality of snap-fit connectors may be configured to be releasably secured to the annular rim. The method further may include releasably securing the front support to the back support by positioning a detent within a detent receiving opening. One of the front support and the back support may include at least one detent and the other of the front support and the back support may include a corresponding plurality of detent receiving openings each being configured to receive the at least one detent to securely position the front support with respect to the back support. The at least one detent may be configured to be released from a respective opening when applying a force to one of the front and back portions of the measuring device. The at least one detent may be configured to be received in a different detent receiving opening after releasing the at least one detent from the respective opening and rotating one of the front and back portions at least 90 degrees. The at least one detent may be formed on the second surface of the front support and extends towards the back support, and wherein the detent receiving openings are formed in the back support.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 1A is a front perspective view of a measuring device having a display, the measuring device being provided in a first orientation;

FIG. 1B is a back perspective view of the measuring device shown in FIG. 1A;

FIG. 2A is a front perspective view of a measuring device having a display, the measuring device being provided in a second orientation;

FIG. 2B is a back perspective view of the measuring device shown in FIG. 2A;

FIG. 3A is a front perspective view of a measuring device having a display, the measuring device being provided in a third orientation;

FIG. 3B is a back perspective view of the measuring device shown in FIG. 3A;

FIG. 4A is a front perspective view of a measuring device having a display, the measuring device being provided in a fourth orientation;

FIG. 4B is a back perspective view of the measuring device shown in FIG. 4A;

FIG. 11 is a perspective view of a back support of the rotation mechanism;

FIG. 12 is a perspective view of a front support of the rotation mechanism; and

FIG. 12A is an enlarged perspective view showing aspects of the front support of the rotation mechanism.

DETAILED DESCRIPTION OF THE DISCLOSURE

Figure 5:
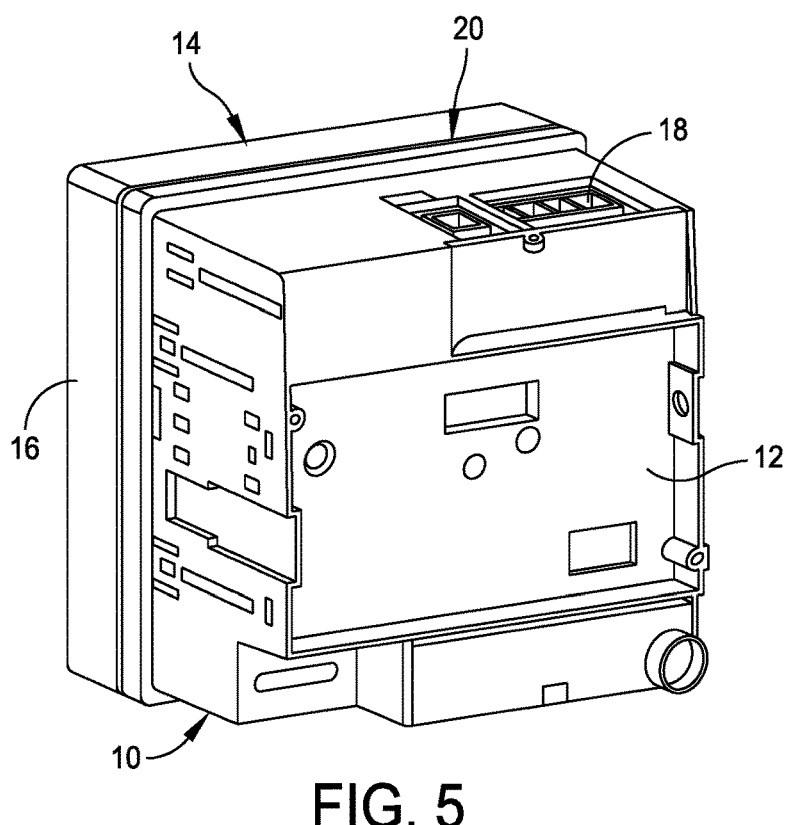
FIG. 5 is a back perspective view of a measuring device having a display and a rotation mechanism of an embodiment of the present disclosure.

This disclosure is not limited in its application to the details of construction and the arrangement of components set forth in the following descriptions or illustrated by the drawings. The disclosure is capable of other embodiments and of being practiced or of being carried out in various ways. Also, the phraseology and terminology used herein is for description purposes and should not be regarded as limiting. The use of "including," "comprising," "having," "containing," "involving," and variations herein, are meant to be open-ended, i.e. "including but not limited to."

Embodiments of the present disclosure are directed to a rotation mechanism that enhances the installation of a measuring device. Specifically, the rotation mechanism enables the measuring device to be installed at various orientations, e.g., 0-, 90- 180- and 270-degrees, while enabling a display mounted on the measuring device to be mounted vertically, e.g., at 0-degree.

The rotation mechanism enables the installer to wire the measuring device at a proper orientation, while being able to rotate the display vertically. The rotation mechanism further enables the rotation of front and back portions of the measuring device to provide improved/flexible access to electrical connections during installation of the measuring device.

In accordance with embodiments of this disclosure, by using the mechanism, the measuring device, e.g., an energy meter device, can be configured to a plurality of orientations depending upon the pre-wiring layout in the panel. In one example implementation (e.g., for square- or rectangular-shaped meters), the measuring device and associated electrical connection can be rotated/configured to four orientations. In other example implementations (e.g., for circular-shaped meters), the measuring device and associated electrical connections can be rotated/configured to substantially any orientation for which the mechanism can be updated accordingly. Embodiments of a rotation mechanism of the present disclosure can be used to provide relative rotation for square- or rectangular-shaped meters or for circular-shaped meters.

Referring to the drawings, and more particularly to FIGS. 1A, 1B, 2A, 2B, 3A, 3B, 4A and 4B, a measuring device, generally indicated at 10, is shown in a variety of orientations. As shown, the measuring device 10 includes a measuring device housing 12, which supports the operatable components of the measuring device, and a display, generally indicated at 14, which, as will be described in greater detail below, is rotatably secured to the measuring device housing. With each orientation of the measuring device 10, the measuring device includes the display 14 mounted on a front side of the measuring device housing 12. In the shown embodiment, the measuring device housing 12 is a square-shaped housing that is used to measure energy within a power system, e.g., an equipment rack. As mentioned above, although the measuring device housing 12 is shown as a square-shaped structure, the measuring device 10 can include a housing having any desired shape or size. It is to be understood that the measuring device housing 12 is sometimes referred to herein simply as a measuring device.

Similarly, the display 14 includes a square-shaped display housing 16 that is thinner than the measuring device housing 12. The display 14 includes a screen or graphical user interface (GUI) provided on a front surface of the display housing 16, the GUI enabling an operator to view information provided on the measuring device 10 and to operate the measuring device. The size and dimensions of the display housing 16 correspond to the size and dimensions of the measuring device housing 12. The display 14 may include any type of interface other than a GUI to enable the operator to view data from the measuring device. As will be described below, a rotation mechanism of the present disclosure is employed to secure the display housing 16 of the display 14 to the measuring device housing 12 of the measuring device to enable a user to rotate the measuring device and the display with respect to one another.

FIGS. 1A and 1B illustrate the measuring device housing 12 of the measuring device 10 in a default first position having a voltage measurement connector 18 provided on a top surface of the measuring device housing. FIGS. 2A and 2B illustrate the measuring device housing 12 of the measuring device 10 in a second position in which the measuring device housing is rotated 90-degrees, with the voltage measurement connector 18 being provided on a side surface of the measuring device housing. FIGS. 3A and 3B illustrate the measuring device housing 12 of the measuring device 10 in a third position in which the measuring device housing is rotated another 90-degrees (180-degrees with respect to the first position), with the voltage measurement connector 18 being provided on a bottom surface of the measuring device housing. FIGS. 4A and 4B illustrate the measuring device housing 12 of the measuring device 10 in a fourth position in which the measuring device housing is rotated another 90-degrees (270-degrees with respect to the first position), with the voltage measurement connector 18 being provided on an opposite side surface of the measuring device housing. With each orientation, the display 14 is shown in a vertical orientation, regardless of the orientation of the measuring device housing 12 of the measuring device 10.

Figure 6:
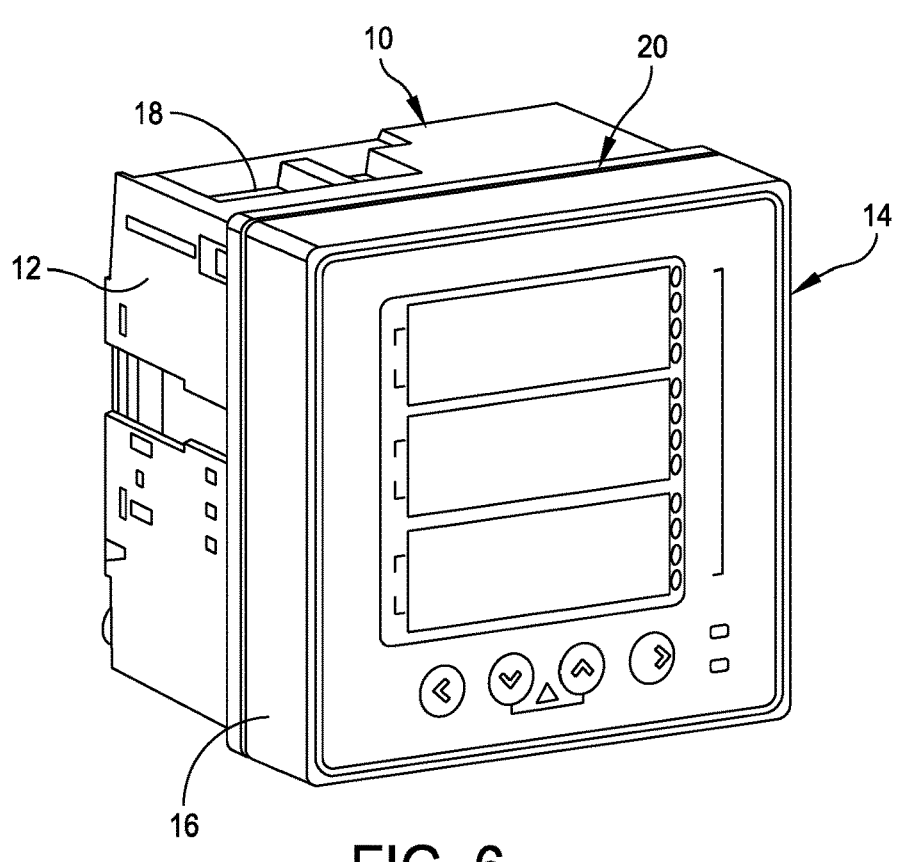
FIG. 6 is a front perspective view of the measuring device shown in FIG. 5.
Figure 7:
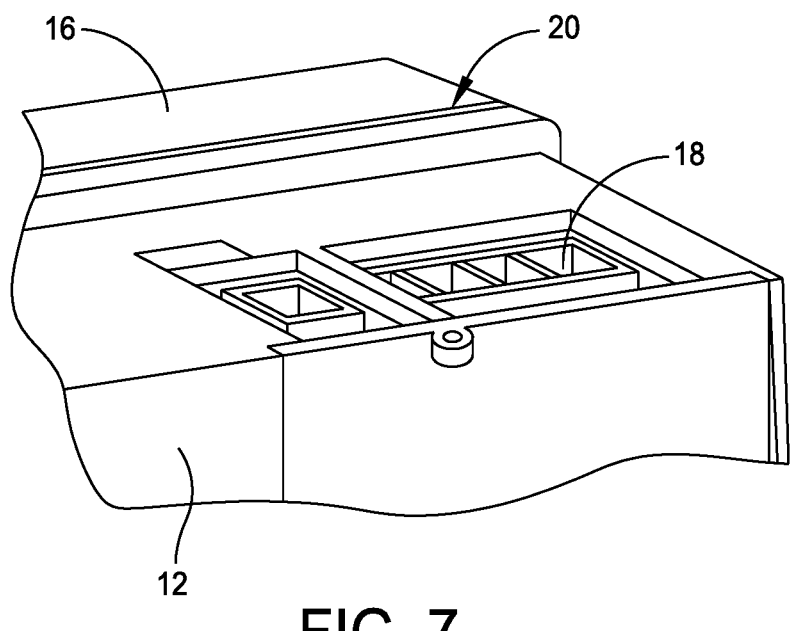
FIG. 7 is an enlarged perspective view of the measuring device shown in FIG. 5.

Referring to FIGS. 5 and 6, a rotation mechanism, generally indicated at 20, is positioned between the measuring device housing 12 and the display housing 16. In one embodiment, the rotation mechanism 20 enables the display housing 16 to be rotated with respect to the measuring device housing 12 in 90-degree intervals to achieve any of the first, second, third and fourth positions shown and described above. Specifically, the rotation mechanism 20 is positioned behind the display housing 16 of the display 14, which sometimes may be referred to as a measuring device front of the measuring device, and in front of measuring device housing 12 of the measuring device 10, which sometimes may be referred to as measuring device back of the measuring device. FIG. 7 shows an enlarged view of the rotation mechanism 20, which is positioned between the measuring device housing 12 of the measuring device 10 and the display housing 16 of the display 14.

Figure 8:
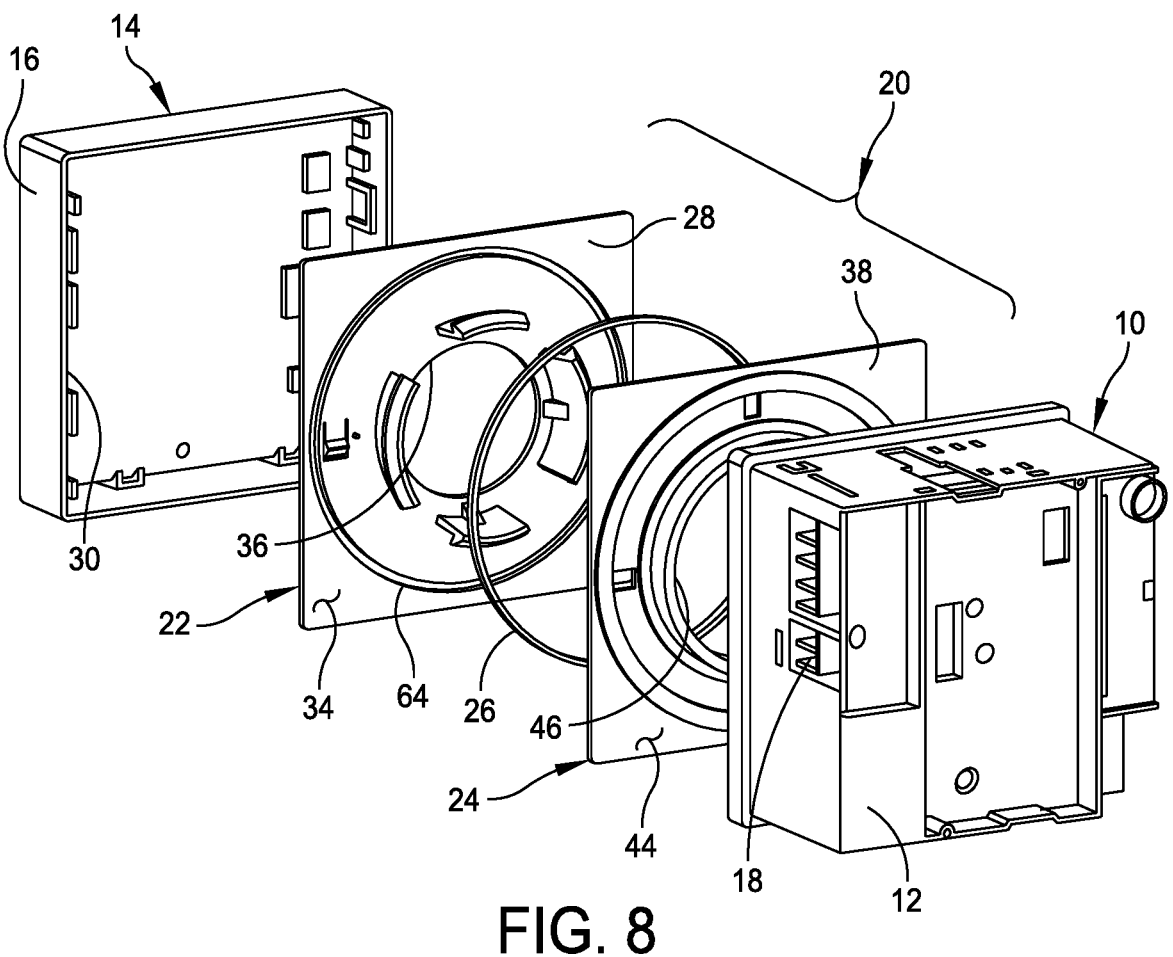
FIG. 8 is an exploded perspective view of the measuring device shown in FIG. 5, showing the parts of the rotation mechanism.
Figure 9:
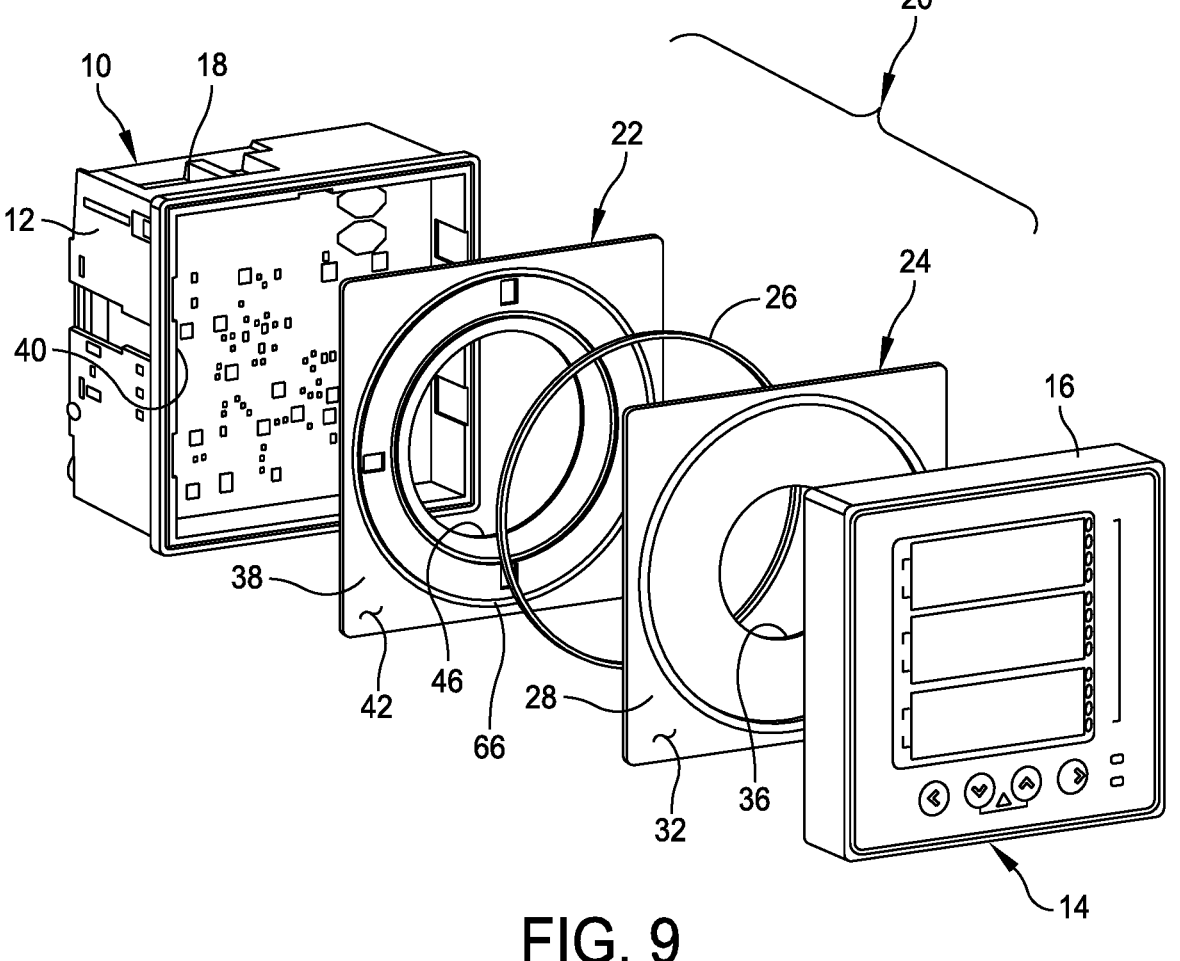
FIG. 9 is an exploded perspective view of the measuring device shown in FIG. 6.

Referring to FIGS. 8 and 9, the rotation mechanism 20 includes a front support, generally indicated at 22, a back support, generally indicated at 24, and a gasket 26, which is disposed between the front support and the back support. The front support 22 is configured to be secured to the display housing 16 of the display 14 and the back support 24 is configured to be secured to the measuring device housing 12 of the measuring device 10. It should be understood that the configuration of the front support 22 and the back support 24 can be reversed, with the back support 24 being secured to the display housing 16 of the display 14 and the front support 22 being secured to the measuring device housing 12 of the measuring device 10. In one embodiment, the front support 22 and the back support 24 are fabricated from a suitable high-strength thermoplastic material, such as polycarbonate (PC) or polycarbonate and acrylonitrile butadiene styrene blend (PCABS), and the gasket 26 is fabricated from a suitable elastomeric or rubber material. When assembled, the front support 22 is rotationally secured to the back support 24, with the gasket 26 being disposed between the front support and the back support. The gasket 26 is provided to protect (IP54 grade rating minimum) wiring extending through the rotation mechanism 20 between the measuring device 10 and the display 14.

The front support 22 includes a square-shaped body 28 that is sized to fit within a recess 30 formed in a back surface of the display housing 16 of the display 14. In one embodiment, the back surface of the display housing 16 includes tabs that releasably engage edges of the body of the front support to secure the front support 22 with respect to the display housing. Other types of systems and/or fasteners can be used in place of tabs to secure the front support 22 to the back surface within the recess 30 of the display housing 16. The body 28 of the front support 22 has first and second opposing surfaces 32, 34 and a circular-shaped opening 36 formed in a center portion of the body of the front support. The first surface 32 of the body 28 of the front support 22 faces the back surface of the display housing 16 of the display 14 when assembled. The second surface 34 of the body 28 of the front support faces 22 the back support 24 when assembled. The front support 22 is configured to be coupled to the display housing 16 of the display 14 (the front portion of the measuring device 10), with the first surface 32 of the front support facing the back surface of the display housing.

Similarly, the back support 24 includes a square-shaped body 38 that is sized to fit within a recess 40 formed in a front surface of the measuring device housing 12 of the measuring device 10. In one embodiment, the front surface of the measuring device housing 12 includes tabs that releasably engage edges of the body 38 of the back support 24 to secure the back support with respect to the measuring device housing. Other types of systems and/or fasteners can be used in place of tabs to secure the back support 24 to the front surface of the measuring device housing 12 of the measuring device 10. The body 38 of the back support 24 has first and second opposing surfaces 42, 44 and a circular-shaped opening 46 formed in a center portion of the back support. The first surface 42 of the body 38 of the back support 24 faces the second surface 34 of the body 28 of the front support 22 when assembled. The second surface 44 of the body 38 of the back support 24 faces the front surface of the measuring device housing 12 of the measuring device 10 when assembled. The back support 24 is configured to be coupled to the measuring device housing 12 (the back portion of the measuring device 10), with the second surface 44 of the back support 24 facing the front surface of the measuring device housing.

The circular-shaped opening 36 of the front support 22 and the circular-shaped opening 46 of the back support 24 are aligned and co-axial with respect to one other to enable wires and/or cables connecting the display housing 16 of the display 14 to the measuring device housing 12 of the measuring device 10 to pass through the rotation mechanism 20. As will be described in greater detail below, the size of the circular-shaped opening 36 of the front support 22 is slightly smaller in diameter than the size of the circular-shaped opening 46 of the back support 24. However, the circular-shaped openings 36, 46 are of sufficient size to enable wires and/or cables used to connect the display housing 16 of the display 14 to the measuring device housing 12 of the measuring device 10.

Further, although the front support 22 and the back support 24 each include a square-shaped body, it should be understood that the shape and size of each support can be selected to fit the shape and size of its respective recess provided in the display housing 16 of the display 14 and the measuring device housing 12 of the measuring device 10. For example, each of the front support 22 and the back support 24 can include a circular-shaped body that is sized to fit within a circular-shaped recess provided in its respective display housing or measuring device housing. Once secured, each of the front support 22 and the back support 24 can be suitably secured to its respective display housing 16 and measuring device housing 12.

Figure 10:
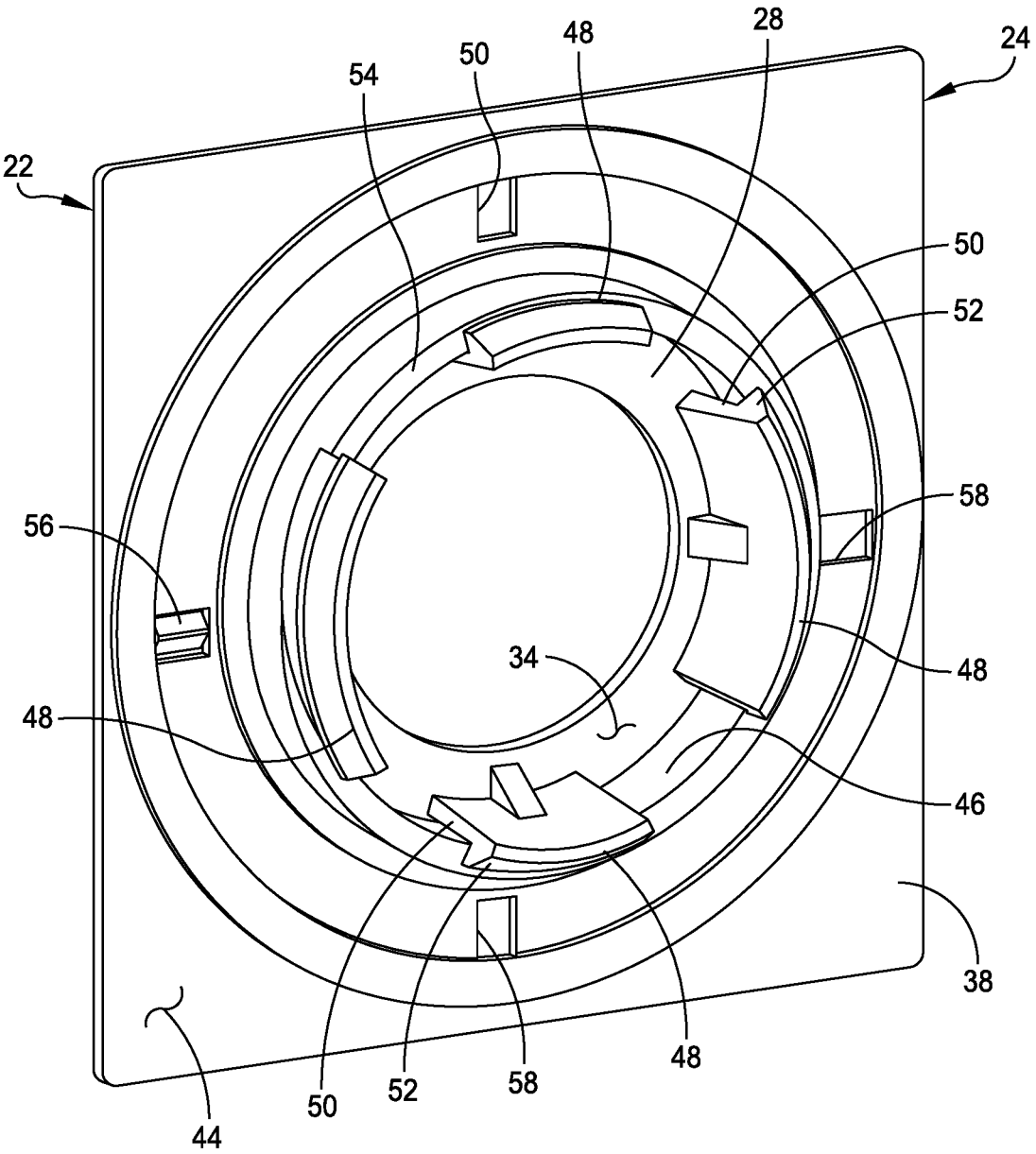
FIG. 10 is a perspective view of the rotation mechanism.

Referring additionally to FIG. 10, the front support 22 includes a connecting feature positioned around a periphery of the circular-shaped opening 36 of the front support. As shown, the connecting feature is configured to be received in the circular-shaped opening 46 of the back support 24 to releasably secure the front support 22 to the back support. Specifically, the connecting feature is formed on the second surface 34 of the body 28 of the front support 22 and extends towards the back support 24, and includes four snap-fit connectors, each indicated at 48, which extend from the body of the front support and are disposed on the periphery of the circular-shaped opening 36 of the front support. The snap-fit connectors 48 are spaced equidistant from each other in a direction perpendicular to a plane of the body 38 of the front support 22. Each snap-fit connector 48 includes a stem portion 50 that extends from the body 38 of the front support 22 and a prong portion 52 that projects outwardly with respect to the stem portion. The stem portion 50 is configured to flex or bend upon application of a force on the prong portion 52 of the snap-fit connector 48. Reference can be made to FIG. 12 showing the snap-fit connectors 48 extending from the body 36 of the front portion 22.

Referring additionally to FIG. 11, the back support 24 includes a mating connecting feature extending towards the measuring device housing 12. Specifically, the second surface 44 of the body 38 of the back support 24 includes an annular rim 54 formed on the body of the back support and configured to be releasably secured by the snap-fit connectors 48 associated with the front support 22. As shown, the annular rim 54 extends towards back portion of the measuring device housing 12, with the annular rim being formed on the second surface 44 of the body 38 of the back support 24 around the circular-shaped opening 46 of the back support. The arrangement is that each snap-fit connector 48 is configured to be self-guiding and to rotate over a sub-surface of the annular rim 54. Once connected, the snap-fit connectors 48 and the annular rim 54 prevent the axial movement of the front support 22 (and the display housing 16) with respect to back support 24 (and the measuring device housing 12), while enabling the rotation of the front support with respect to the measuring device housing, thereby enabling the rotation of the display housing and the display to achieve the positions illustrated in FIGS. 1A, 1B, 2A, 2B, 3A, 3B, 4A and 4B. To release the front support 22 from the back support 24, each of the prong portions 52 of the snap-fit connectors 48 are pressed inwardly to clear the prong portions from the annular rim 54 thereby enabling the front support to be moved axially away from the back support. For each snap-fit connector 48, the stem portion 50 is flexible to enable the bending movement of the snap-fit connector to clear the prong portion 52 from the annular rim 54.

It should be understood that the connecting feature, e.g., the snap-fit connectors 48, may be provided on the first surface 42 of the back support 24 and that the mating connecting feature, e.g., the annular rim 54, may be provided on the second surface 34 of the front support 22, and still fall within the scope of the present disclosure.

As noted, the back support 24 and the measuring device housing 12 are configured to be rotated in a clockwise or counterclockwise direction with respect to the front support 22 and the display housing 16 about an axis of the circular-shaped opening 36 formed in the center portion of the front support and the circular-shaped opening 46 formed in the center portion of the back support 24 to enable flexible access to the electrical connections on the measuring device housing 12 (the back portion) of the measuring device 10. To maintain the display 14 in a desired position, e.g., one of the positions identified in FIGS. 1A, 1B, 2A, 2B, 3A, 3B, 4A and 4B, the front support 22 includes a detent 56 and the back support 24 includes several corresponding detent receiving openings, each indicated at 58. As shown, there are four detent receiving openings 58 formed in the body 38 of the back support 24, with each detent receiving opening being positioned 90-degrees from one another. Each detent receiving opening 58 is configured to receive the detent 56 to securely position the front support 22 with respect to the back support 24. The detent 56 is configured to make a positive clicking sound when entering its respective detent receiving opening 60 to inform the person installing the metering device 10 that the display 14 is properly seated.

Figure 10A:
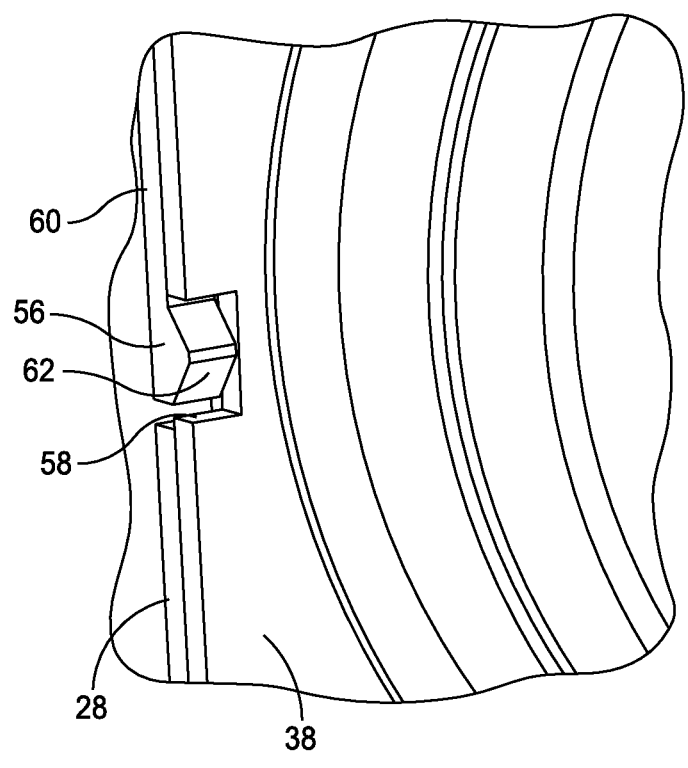
FIGS. 10A and 10B are enlarged perspective views showing aspects of the rotation mechanism.
Figure 10B:
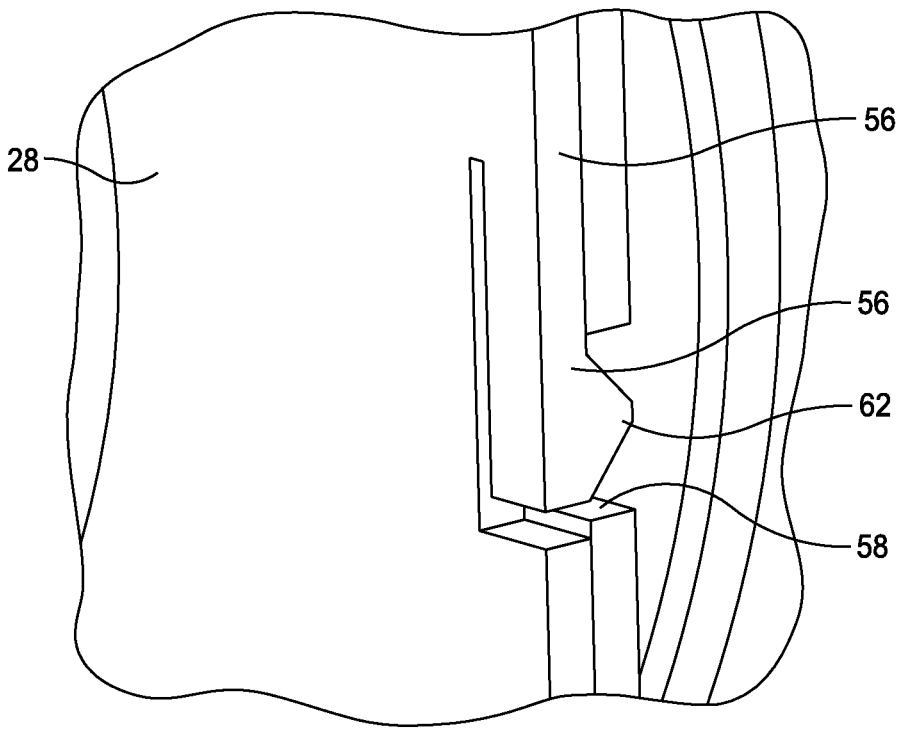

Referring to FIGS. 10A and 10B, the detent 56 is configured to be released from a respective detent receiving opening 58 when applying a force to one of the display housing 16 of the display 14 and the measuring device housing 12 of the measuring device 10. Specifically, the detent 56 includes a sloped surface that engages an edge of the detent receiving opening 58 to enable the detent to be removed from the detent receiving opening when applying a rotational force on either the measuring device housing 12 or the display housing 16. The detent 56 is configured to be received in a different detent receiving opening 58 after releasing the detent from its respective detent receiving opening and rotating one of the display housing 16 and the measuring device housing 12 at least 90 degrees. Referring additionally to FIG. 12A, the detent 56 is formed in the body 28 of the front support 22 and includes a tab portion 60 that flexes with respect to the body and a detent portion 62 formed at an end of the tab portion. The arrangement is such that the detent portion 62 of the detent 56 is configured to flex when a force is applied on the detent portion, with the tab portion 60 enabling the detent portion to move with respect to the body 28 of the front support 22. In the shown embodiment, the detent portion 62 of the detent 56 is formed on the second surface 34 of the front support 22 and extends towards the back support 24 and the detent receiving openings 58 are formed in the back support.

In some embodiments, the detent portion 62 of the detent 56 can be shaped and sized to increase or decrease the resistance of the detent portion as the display housing 16 and the front support 22 are rotated with respect to the measuring device housing 12 and the back support 24. As noted above, the size and shape of the detent portion 62 of the detent 56 can be selected to make a clicking sound louder or softer when entering its respective detent receiving opening 60 to inform the person installing the metering device 10 that the display 14 is properly seated.

As noted, the gasket 26 is provided to prevent unwanted contaminants, e.g., moisture, from entering the space for the cables between the display housing 16 of the display 14 and the measuring device housing 12 of the measuring device 10. As shown, the gasket is disposed within a circular recess 64 formed in the second surface 34 of the front support 22 and a circular recess 66 formed in the first surface 42 of the back support 24. The circular recesses 64, 66 of the front support 22 and the back support 24, respectively, are aligned with one another to enable the gasket 26 to be placed within them when assembling the rotation mechanism 20. In one embodiment, the gasket 26 has a circular cross-section to enable the gasket to seat firmly with its respective circular recesses 64, 66. Other gasket shapes can be provided.

In some embodiments, as mentioned above, the circular-shaped opening 36 formed in the center portion of the front support 22 has a first diameter and the circular-shaped opening 46 formed in the center portion of the back support 24 has a second, different diameter.

In some embodiments, although aspect of the rotation mechanism 20 described herein relate to use within a measuring device 10 to enable the relative rotation of the display housing 16 and the measuring device housing 12, the rotation mechanism can be used to orient one device with respect to another device.

A method of assembling the measuring device 10 to provide flexible access to electrical connections during installation of the measuring device includes releasably securing the front support 22 to the display housing 16. The method further includes releasably securing the back support 24 to the measuring device housing 12 of the measuring device 10, which includes electrical connections of the measuring device. The method further includes positioning a connecting feature, e.g. the snap-fit connectors 48, of the front support 22 within the circular-shaped opening 46 of the back support 24 so that the connecting feature engages a mating connection feature, e.g., the annular rim 54, to releasably secure the front support to the back support. Once secured, the method further includes rotating the back support 24 and the measuring device housing 12 in a clockwise or counterclockwise direction with respect to the front support 22 and the display housing 16 about an axis of the circular-shaped opening 36 formed in the center portion of the front support and the circular-shaped opening 46 formed in the center portion of the back support 24 to enable flexible access to the electrical connections on the measuring device housing 12.

The method further may include releasably securing the front support 22 and the display housing 16 to the back support 24 and the measuring device housing 12 by positioning a detent 56 within a detent receiving opening 58. Specifically, the front support 22 includes the detent 56 and the back support 24 includes several, e.g., four, detent receiving openings 58, each being configured to receive the detent to securely position the front support with respect to the back support. During installation, the detent 56 is configured to be released from its respective detent receiving opening 58 when applying a force to the display housing 16 and/or the measuring device housing 12, with the detent being configured to be received in an adjacent detent receiving opening after releasing the detent from the respective opening and rotating the display and/or the measuring device housing at least 90 degrees. A person installing the measuring device 10 can orient the voltage measurement connector 18 of the measuring device housing 12 with a cable connector and once connected, rotate the display housing 12 to a desired orientation.

The method further may include positioning the gasket 26 between the front support 22 and the back support 24. Specifically, the gasket 26 is disposed within the circular recess 64 formed in the second surface 34 of the body 28 of the front support 22 and the circular recess 68 formed in the first surface 42 of the body 38 of the back support 24 when securing the front support to the back support. The gasket 26 is provided to protect the wires and/or cables connecting the display housing 16 of the display 14 to the measuring device housing 12 of the measuring device 10.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A mechanism for enabling relative rotation of front and back portions of a measuring device to provide flexible access to electrical connections during installation of the measuring device, the mechanism comprising:

a front support having first and second opposing surfaces and a circular-shaped opening formed in a center portion of the front support, the front support being configured to be coupled to a front portion of the measuring device including a display of the measuring device; and a back support comprising a body with first and second opposing surfaces and a circular-shaped opening formed in a center portion of the body, the body of the back support being configured to be recessed within a back portion of the measuring device including electrical connections of the measuring device, wherein one of the front support and the back support includes a connecting feature positioned around a periphery of the circular-shaped opening, the connecting feature being configured to be received in the circular-shaped opening of the other of the front support and the back support to releasably secure the one of the front support and the back support to the other of the front support and the back support, and wherein the back support and the back portion of the measuring device are configured to be rotated in a clockwise or counterclockwise direction with respect to the front support and the front portion of the measuring device about an axis of the circular-shaped opening formed in the center portion of the front support and the circular-shaped opening formed in the center portion of the back support to enable flexible access to the electrical connections on the back portion of the measuring device.

2. The mechanism of claim 1, wherein the connecting feature is formed on the second surface of the front support and extends towards the back support.

3. The mechanism of claim 2, wherein the second surface of the back support includes a mating connecting feature configured to be releasably secured by the connecting feature of the front support, the mating connecting feature extending towards the back portion of the measuring device.

4. The mechanism of claim 3, wherein the connecting feature includes a plurality of snap-fit connectors disposed on the periphery of the circular-shaped opening of the front support.

5. The mechanism of claim 4, wherein the mating connecting feature includes an annular rim formed on the second surface of the back support around the circular-shaped opening of the back support, the plurality of snap-fit connectors being configured to be releasably secured to the annular rim.

6. The mechanism of claim 5, wherein each snap-fit connector of the plurality of the snap-fit connectors is configured to be self-guiding and to rotate over a sub-surface of the annular rim.

7. The mechanism of claim 1, wherein one of the front support and the back support includes at least one detent and the other of the front support and the back support includes a corresponding plurality of detent receiving openings each being configured to receive the at least one detent to securely position the front support with respect to the back support.

8. The mechanism of claim 7, wherein the at least one detent is configured to be released from a respective opening when applying a force to one of the front and back portions of the measuring device.

9. The mechanism of claim 8, wherein the at least one detent is configured to be received in a different detent receiving opening after releasing the at least one detent from the respective opening and rotating one of the front and back portions at least 90 degrees.

10. The mechanism of claim 7, wherein the at least one detent is formed on the second surface of the front support and extends towards the back support.

11. The mechanism of claim 9, wherein the detent receiving openings are formed in the back support.

12. The mechanism of claim 1, wherein the circular-shaped opening formed in the center portion of the front support has a first diameter and the circular-shaped opening formed in the center portion of the back support has a second, different diameter.

13. The mechanism of claim 1, further comprising a gasket positioned between the front support and the back support.

14. A method of assembling a measuring device including front and back portions configured to rotate with respect to one another to provide flexible access to electrical connections during installation of the measuring device, the method comprising:

releasably securing a front support to a front portion of the measuring device including a display of the measuring device, the front support including first and second opposing surfaces and a circular-shaped opening formed in a center portion of the front support;

releasably securing a back support to a back portion of the measuring device including electrical connections of the measuring device, the back portion comprising a body with first and second opposing surfaces and a circular-shaped opening formed in a center portion of the body, wherein the body of the back support is recessed within the back portion of the measuring device;

positioning a connecting feature of one of the front support and the back support within the circular-shaped opening of the other of the front support and the back support to releasably secure the one of the front support and the back support to the other of the front support and the back support, the connecting feature being positioned around a periphery of the circular-shaped opening of the one of the front support and the back support; and rotating the back support and the back portion of the measuring device in a clockwise or counterclockwise direction with respect to the front support and the front portion of the measuring device about an axis of the circular-shaped opening formed in the center portion of the front support and the circular-shaped opening formed in the center portion of the back support to enable flexible access to the electrical connections on the back portion of the measuring device.

15. The method of claim 14, wherein the connecting feature is formed on the second surface of the front support and extends towards the back support, and wherein the second surface of the back support includes a mating connecting feature configured to be releasably secured by the connecting feature of the front support, the mating connecting feature extending towards back portion of the measuring device.

16. The method of claim 15, wherein the connecting feature includes a plurality of snap-fit connectors disposed on the periphery of the circular-shaped opening of the front support, and wherein the mating connecting feature includes an annular rim formed on the second surface of the back support around the circular-shaped opening of the back support, the plurality of snap-fit connectors being configured to be releasably secured to the annular rim.

17. The method of claim 15, further comprising releasably securing the front support to the back support by positioning a detent within a detent receiving opening, wherein one of the front support and the back support includes at least one detent and the other of the front support and the back support includes a corresponding plurality of detent receiving openings each being configured to receive the at least one detent to securely position the front support with respect to the back support.

18. The method of claim 17, wherein the at least one detent is configured to be released from a respective opening when applying a force to one of the front and back portions of the measuring device, and wherein the at least one detent is configured to be received in a different detent receiving opening after releasing the at least one detent from the respective opening and rotating one of the front and back portions at least 90 degrees.

19. The method of claim 17, wherein the at least one detent is formed on the second surface of the front support and extends towards the back support, and wherein the detent receiving openings are formed in the back support.

20. The method of claim 14, further comprising positioning a gasket between the front support and the back support.

\* \* \* \* \*